United States Patent
Gyllenskog

(10) Patent No.: US 10,777,297 B2
(45) Date of Patent: Sep. 15, 2020

(54) AGE-BASED REFRESH OF FIRMWARE

(71) Applicant: Micron Technology, Inc., Boise, ID (US)

(72) Inventor: Christian M. Gyllenskog, Meridian, ID (US)

(73) Assignee: MICRON TECHNOLOGY, INC., Boise, ID (US)

(*) Notice: Subject to any disclaimer, the term of this patent is extended or adjusted under 35 U.S.C. 154(b) by 18 days.

(21) Appl. No.: 16/215,327

(22) Filed: Dec. 10, 2018

(65) Prior Publication Data

US 2020/0183594 A1 Jun. 11, 2020

(51) Int. Cl.
*G11C 29/52* (2006.01)
*G06F 3/06* (2006.01)
*G06F 11/10* (2006.01)

(52) U.S. Cl.
CPC ............ *G11C 29/52* (2013.01); *G06F 3/0619* (2013.01); *G06F 3/0659* (2013.01); *G06F 3/0673* (2013.01); *G06F 11/1068* (2013.01)

(58) Field of Classification Search
CPC .............. G11C 16/3418; G11C 11/406; G11C 13/0033
See application file for complete search history.

(56) References Cited

U.S. PATENT DOCUMENTS

| | | | |
|---|---|---|---|
| 5,606,660 A * | 2/1997 | Estakhri | G06F 11/1004 714/38.1 |
| 6,697,909 B1 * | 2/2004 | Wang | G06F 12/0802 365/222 |
| 7,307,908 B2 * | 12/2007 | Gilton | G11C 5/005 257/19 |
| 7,467,337 B2 * | 12/2008 | Nakamura | G11C 29/42 714/704 |
| 9,881,682 B1 * | 1/2018 | Tang | G11C 16/3427 |
| 2003/0021170 A1 * | 1/2003 | Perner | G11C 8/18 365/201 |
| 2005/0243626 A1 * | 11/2005 | Ronen | G11C 11/406 365/222 |
| 2007/0255895 A1 * | 11/2007 | Mangione-Smith | G06F 13/1636 711/106 |
| 2008/0068912 A1 * | 3/2008 | Lee | G11C 11/40622 365/222 |
| 2011/0231730 A1 * | 9/2011 | Allen | G06F 11/106 714/758 |
| 2011/0235434 A1 * | 9/2011 | Byom | G11C 16/10 365/185.25 |

(Continued)

*Primary Examiner* — Steve N Nguyen
(74) *Attorney, Agent, or Firm* — Nicholson De Vos Webster & Elliott LLP

(57) ABSTRACT

A method to refresh copies of firmware based on ages of those copies of the firmware is described. The method includes determining, by a memory subsystem, an age of a first copy of firmware, which is stored in the memory components of the memory subsystem, is greater than a refresh interval, wherein the age of the copy of firmware is tracked in a firmware age table. In response to determining that the age of the first copy of the firmware is greater than the refresh interval, the memory subsystem refreshes the first copy of the firmware in the memory components. Further, the memory subsystem updates the age of the first copy of the firmware in the firmware age table in response to refreshing the first copy of the firmware.

18 Claims, 6 Drawing Sheets

(56) References Cited

U.S. PATENT DOCUMENTS

| | | | | |
|---|---|---|---|---|
| 2014/0059405 A1* | 2/2014 | Syu | ................... | G11C 16/349 714/773 |
| 2015/0135027 A1* | 5/2015 | Yanamanamanda | ................... | G11C 29/50004 714/721 |
| 2015/0347313 A1* | 12/2015 | Wang | ................... | G06F 16/2282 711/221 |
| 2016/0005452 A1* | 1/2016 | Bae | ................... | G11C 29/24 714/764 |
| 2016/0063279 A1* | 3/2016 | Hars | ................... | H04L 9/3228 713/190 |
| 2016/0098216 A1* | 4/2016 | Huang | ................... | G06F 11/073 714/37 |
| 2018/0181454 A1* | 6/2018 | Lin | ................... | G06F 3/064 |

* cited by examiner

| FIRMWARE AGE TABLE 400 | |
|---|---|
| IDENTIFIER 402 | AGE DATA 404 |
| A | JANUARY 1, 2018 |
| B | JUNE 30, 2017 |
| C | JANUARY 1, 2017 |
| D | JUNE 30, 2016 |

FIG. 4

| FIRMWARE AGE TABLE 400 ||
| --- | --- |
| IDENTIFIER 402 | AGE DATA 404 |
| A | JANUARY 1, 2018 |
| B | JUNE 30, 2017 |
| C | JANUARY 1, 2017 |
| D | JUNE 30, 2018 |

FIG. 5

AGE-BASED REFRESH OF FIRMWARE

TECHNICAL FIELD

The present disclosure generally relates to refreshing copies of firmware, and more specifically, relates to refreshing copies of firmware stored in media based on the age of each copy.

BACKGROUND ART

A memory sub-system can be a storage system, such as a solid-state drive (SSD), an embedded Multi-Media Controller (eMMC) drive, a Universal Flash Storage (UFS) drive, or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory subsystem to store data in the memory components and to retrieve data from the memory components. For example, memory subsystems include firmware for managing the memory components. The firmware processes memory requests (e.g., write/store and read data commands/requests) received from a host system and communicates with a hardware controller for fulfillment of the memory requests by the memory components to the host system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 illustrates a firmware age table, which stores age data for four copies of the firmware stored in memory components, in accordance with some embodiments of the present disclosure.

FIG. 5 illustrates an update to age data in the firmware age table for a recently refreshed copy of the firmware, in accordance with some embodiments of the present disclosure.

DETAILED DESCRIPTION

Figure 1:
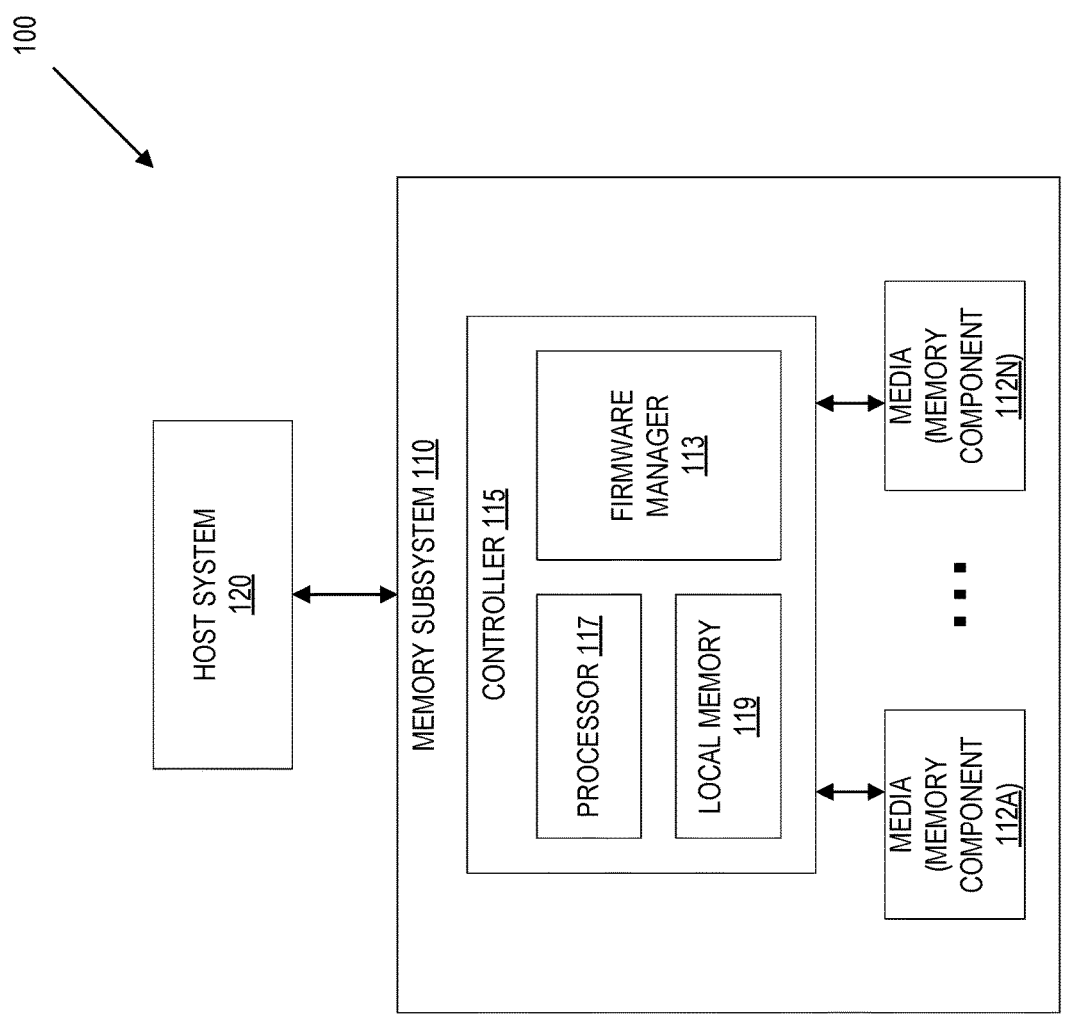
FIG. 1 illustrates an example computing environment that includes a memory subsystem, in accordance with some embodiments of the present disclosure.

Aspects of the present disclosure are directed to maintaining copies of firmware in different age profiles and refreshing the copies of firmware based on age in a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, an embedded Multi-Media Controller (eMMC) drive, a Universal Flash Storage (UFS) drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

Memory subsystems include firmware for managing memory components (e.g., memory cells). The firmware processes memory requests (e.g., write/store and read data commands/requests) received from a host system and communicates with a hardware controller for fulfillment of the memory requests by the memory components. The hardware controller performs operations in relation to the memory components (e.g., error correction on segments of the memory components, setting/resetting cells, etc.) based on communications from the firmware. Accordingly, the firmware is critical to proper performance of the memory subsystem, including fulfillment of host system memory requests. When bit errors are present in the firmware (e.g., one or more bits/codewords in the firmware contain errors), operation of the memory subsystem can be affected.

Bit errors can be introduced to the firmware while the firmware is residing in memory components (i.e., prior to the memory subsystem reading the firmware from the memory components and loading the firmware to main memory). For example, the memory components that store the firmware can include memory technologies in which stored data can degrade over time. In particular, storage of data in these memory components can degrade as a result of the passage of time, multiple reads/writes, and/or other events such that voltages, resistivities, or other characteristics that indicate the value of a bit/cell are altered from an originally written state to an incorrect/error state (e.g., altered from an original/correct set state to an error/incorrect unset state or from an original/correct unset state to an error/incorrect set state). These bit errors can be corrected using parity bits stored along with the firmware, but parity bits only offer correction up to a predefined limit (i.e., correction for a certain number of bit errors based on the number of utilized parity bits).

To ensure proper performance of the memory subsystem, multiple copies of the firmware (i.e., multiple copies of the computer/machine code representing logic of the firmware) are stored in memory components along with parity bits for bit error correction. For example, each copy of the firmware is stored in a separate location/block in the memory components along with corresponding parity bits. In this configuration, the memory subsystem reads a first copy of the firmware from the memory components and checks/corrects for errors in this first copy of the firmware. When the memory subsystem determines that the first copy of the firmware has a number of bit errors that is less than or equal to a correctable threshold number of errors (e.g., less than or equal to a number of bit errors that are correctable using the parity bits), the memory subsystem corrects for any bit errors and loads the first copy of the firmware into main/local memory of the memory subsystem such that the memory subsystem can begin processing host system memory requests and performing other memory subsystem operations.

When the memory subsystem determines that the first copy of the firmware has a number of bit errors that exceeds the correctable threshold number of errors, the memory subsystem reads a second copy of the firmware that is also stored in the memory components. The memory subsystem again checks/corrects for bit errors to determine whether the number of bit errors in the second copy of the firmware exceeds the correctable threshold number of bit errors. When the memory subsystem determines that the second copy of the firmware has a number of bit errors that is less than or equal to the correctable threshold number of errors, the memory subsystem corrects for any bit errors and loads the second copy of the firmware into main memory. Additionally, the memory subsystem copies the corrected second copy of the firmware to the location of the first copy of the firmware to ensure that the first copy of the firmware does not contain bit errors and can be potentially used in the future. Although described in relation to two copies of the firmware, the process of finding a useable/acceptable copy of the firmware could require reading and refreshing more than two copies of the firmware. Since the copies of the firmware can all be stored/refreshed in the memory components at the same time and susceptible to similar conditions/events (e.g., susceptible to the same amount of time/age-based degradation), the number of bit errors in each copy will likely be similar. Accordingly, reading and refreshing multiple copies of the firmware can be needed before locating a useable/acceptable copy. Thus, this process of refreshing copies of the firmware in response to detection of bit errors results in additional reading, correction, and program and erase (PE) cycles that can cause additional degradation of data in the memory components.

Aspects of the present disclosure address the above and other deficiencies by refreshing copies of the firmware responsive to the ages of the copies instead of only in response to bit errors. For example, the memory subsystem sets or otherwise stores a firmware refresh interval (e.g., twenty-four months) and monitors the age of each copy of the firmware stored in the memory components (i.e., the period of time each copy of the firmware was last written/refreshed in the memory components). Upon the memory subsystem determining that a copy of the firmware has reached the firmware refresh interval, the memory subsystem refreshes this copy of the firmware. In one embodiment, the firmware refresh interval is set based on the type of the memory components. For example, when the memory components are NAND memory, the firmware refresh interval can be set to a period corresponding to the degradation rate of this type of media (e.g., the firmware refresh interval is set to twenty-four months for NAND memory components). In contrast, when the memory components are erasable programmable read-only memory (EPROM), the firmware refresh interval can be set to a period corresponding to the degradation rate of this type of media (e.g., the refresh interval is set to sixty months for EPROM components). In some embodiments, the copies of the firmware can be maintained with staggered ages to minimize the number of refresh operations and to ensure that at least one useable/acceptable copy of the firmware is always available. For example, when a firmware refresh interval is twenty-four months, a first copy of the firmware is initially designated as being six months old, a second copy of the firmware is initially designated as being eighteen months old, a third copy of the firmware is initially designated as being twelve months old, and a fourth copy of the firmware is initially designated as being just refreshed (i.e., the fourth copy of the firmware is zero months old). In some embodiments, the memory subsystem can read the newest/youngest copy of the firmware for loading into main memory. However, in other embodiments, other reading techniques can be employed (e.g., performing a round-robin read of copies of the firmware). Additional details of the memory subsystem will be described below.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include an SLC portion and one of a MLC portion, a TLC portion, or a QLC portion of memory cells. Each of the memory cells can store one or more bits of data (e.g., data blocks) used by the host system 120.

Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions (e.g., firmware) for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. For example, firmware loaded in the local memory 119 and performed/executed by the processor 117 can include instructions and other logic for performing or assisting in performing one or more of the operations described above. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a firmware manager 113 that can refresh copies of the firmware stored in the memory components 112A to 112N based on an age of the copies of the firmware. In some embodiments, the controller 115 includes at least a portion of the firmware manager 113. For example, the controller 115 can include a processor 117 (processing device) configured to execute instructions stored in local memory 119 for performing the operations described herein. In some embodiments, the firmware manager 113 is part of the host system 120, an application, or an operating system.

As noted above, the firmware manager 113 can refresh copies of the firmware stored in memory components 112A to 112N based on an age of the copies of the firmware. In addition to the copies of the firmware, the memory components 112A to 112N can store host system 120 data (e.g., data to be read by the host system 120 and/or data written by the host system 120). In other embodiments, the copies of the firmware can be stored in a set of memory components that are separate from the memory components used to store host system 120 data. For example, (1) the copies of the firmware can be stored in a first dedicated region/partition of the memory components 112A to 112N and the host system 120 data is stored in a second dedicated region/partition of the memory components 112A to 112N or (2) the memory subsystem 110 can include separate sets of memory components 112A to 112N for the copies of the firmware and the host system 120 data. In either example embodiment, the firmware manager 113 manages each copy of the firmware to ensure a useable/acceptable copy is available for loading into the local memory 119. Further details with regards to the operations of the firmware manager 113 are described below.

Figure 2:
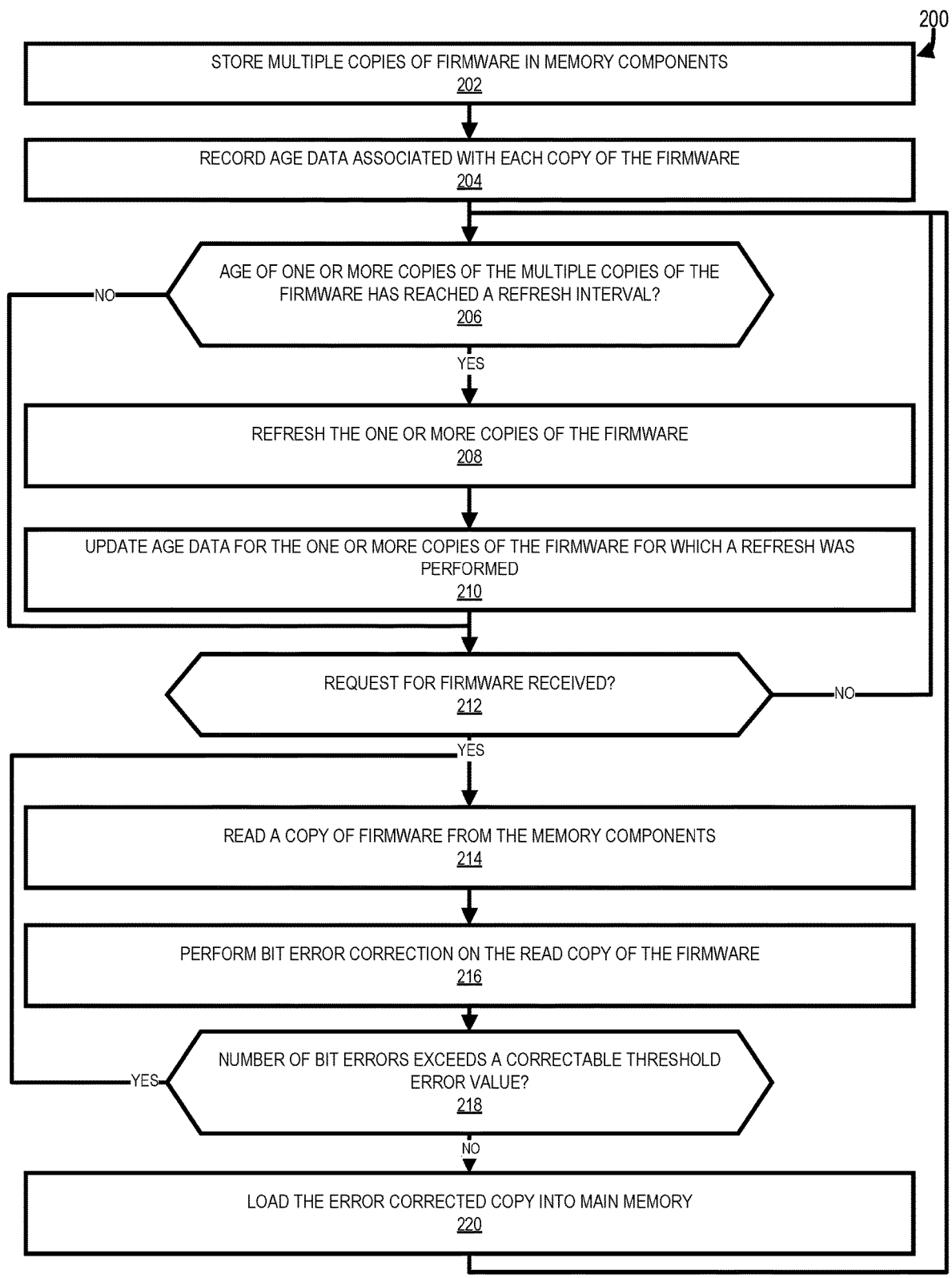
FIG. 2 is a flow diagram of an example method to refresh copies of the firmware stored in memory components based on ages of those copies of the firmware, in accordance with some embodiments of the present disclosure.

FIG. 2 is a flow diagram of an example method 200 to refresh copies of the firmware stored in memory components 112A to 112N based on ages of those copies of the firmware, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the firmware manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 3:
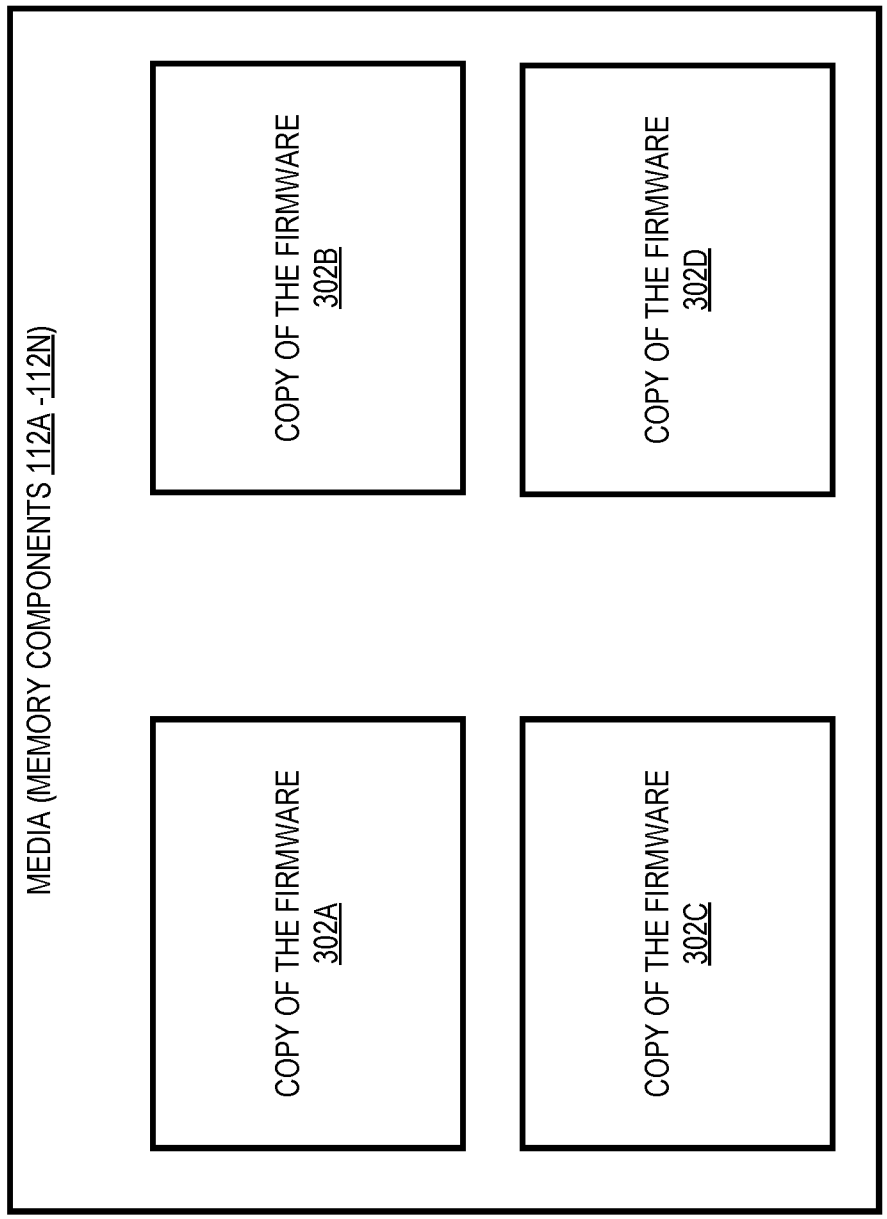
FIG. 3 illustrates four copies of the firmware stored in memory components, in accordance with some embodiments of the present disclosure.

At block 202, the processing device stores multiple copies of the firmware in the memory components 112A to 112N. For example, as shown in FIG. 3, the processing device can store four copies of the firmware 302A-302D in the memory components 112A to 112N. Although shown with four copies of the firmware 302A-302D, in other embodiments, the processing device can store any number of copies of the firmware 302 greater than one (e.g., two, three, four, five, etc. copies of the firmware 302) in the memory components 112A to 112N at block 202. In one embodiment, the firmware 302 is retrieved/accessed from a device coupled to the processing device and loaded into the memory components 112A to 112N at block 202. For example, during manufacture or configuration of the processing device (e.g., the memory subsystem 110), the processing device can be coupled to an external device for loading copies of the firmware 302 onto the processing device. In this configuration, the processing device retrieves/accesses the firmware 302 from the external device and stores multiple copies of the firmware 302 in locations of the memory components 112A to 112N. In some embodiments, the copies of the firmware 302 are stored in separate and/or non-adjacent locations in the memory components 112A to 112N (e.g., in separate and/or non-adjacent blocks in the memory components 112A to 112N).

In one embodiment, the processing device stores the copies of the firmware 302A-302D initially at the same time (i.e., the first time described above), but each copy of the firmware 302A-302D is refreshed in the memory components 112A to 112N at a different time at block 202 until staggered ages are achieved for the copies of the firmware 302A-302D. For example, the processing device stores the copies of the firmware 302A-302D in the memory components 112A to 112N initially at a first time. At a second time, which occurs after the first time (e.g., the second time is six months following the first time), the processing device refreshes the copy of the firmware 302A in the memory components 112A to 112N. At a third time, which occurs after the second time (e.g., the third time is six months following the second time), the processing device refreshes the copy of the firmware 302B in the memory components 112A to 112N. At a fourth time, which occurs after the third time (e.g., the fourth time is six months following the third time), the processing device refreshes the copy of the firmware 302C in the memory components 112A to 112N. Accordingly, the ages of the copies of the firmware 302A-302D are staggered such that each copy of the firmware 302 is separated from the next youngest copy of the firmware 302 by the same period of time (e.g., six months). As used herein, refreshing data stored in the memory components 112A to 112N (e.g., copies of the firmware 302) includes the processing device reading the data from a location in the memory components 112A to 112N, the processing device correcting for bit errors in the read data to produce corrected data, and the processing device writing the corrected data to the same location and/or a different location in the memory components 112A to 112N.

In an alternate embodiment, the processing device stores the copies of the firmware 302A-302D initially at the same time (i.e., the first time described above), but, as will be described in greater detail below, age data of each copy of the firmware 302A-302D includes a different data/time to simulate that the copies of the firmware 302A-302D were stored in the memory components 112A to 112N at a different time.

In another alternate embodiment, the processing device stores the copies of the firmware 302 in the memory components 112A to 112N at different times. For example, the processing device may wait hours, days, or months in between storing each copy of the firmware 302 in the memory components 112A to 112N. For instance, in the example shown in FIG. 3, the processing device stores the copy of the firmware 302A in the memory components 112A to 112N at a first time (e.g., initially when manufacturing or configuring the processing device), the processing device stores the copy of the firmware 302B in the memory components 112A to 112N at a second time, the processing device stores the copy of the firmware 302C in the memory components 112A to 112N at a third time, and the processing device stores the copy of the firmware 302D in the memory components 112A to 112N at a fourth time.

The copies of the firmware 302 can be stored along with parity bits to provide error correction capabilities. For example, data stored in the memory components 112A to 112N may degrade over time as a result of several factors, including degradation due to the passage of time, reads to bits or blocks of the memory components 112A to 112N, and/or writes to adjacent bits or blocks of the memory components 112A to 112N. Accordingly, the parity bits allow correction for a specified number of bit errors, which corresponds to the number of parity bits stored along with the copies of the firmware 302.

As noted above, the processing device can store two or more copies of the firmware 302 in the memory components 112A to 112N at block 202. For purposes of illustration, the four copies of the firmware 302A-302D shown in FIG. 3 will be used for explaining the method 200.

At block 204, the processing device records age data for each copy of the firmware 302 stored in the memory components 112A to 112N. For example, FIG. 4 shows a firmware age table 400 for tracking ages of copies of the firmware 302 according to one example embodiment. As shown in FIG. 4, the firmware age table 400 includes (1) an identifier 402 for each copy of the firmware 302 and (2) age data 404 associated with each copy of the firmware 302. As shown in FIG. 4, the age data 404 of a copy of the firmware 302 is a timestamp that corresponds to the last time the copy of the firmware 302 was written/refreshed in the memory components 112A to 112N. The example firmware age table 400 is populated according to the copies of the firmware 302A-302D shown in FIG. 3. As shown in FIG. 4, (1) the copy of the firmware 302A, with an identifier 402 of "A", has age data 404 of Jan. 1, 2018; (2) the copy of the firmware 302B, with an identifier 402 of "B", has age data 404 of Jun. 30, 2017; (3) the copy of the firmware 302C, with an identifier 402 of "C", has age data 404 of Jan. 1, 2017; and (4) the copy of the firmware 302D, with an identifier 402 of "D", has age data 404 of Jun. 30, 2016. As copies of the firmware 302 are rewritten/refreshed in the memory components 112A to 112N, the processing device updates age data 404 in the firmware age table 400 as will be described below. In one embodiment, the processing device initially records staggered age data 404 for the copies of the firmware 302. For example, despite creating the copies of the firmware 302 on the same date/time, each copy of the firmware 302 can be artificially designated with a different age data 404 (e.g., different dates/times) to enable a staggered refresh cycle. Referring to the example in FIG. 4, all four copies may be initially copied to memory components 112A to 112N on Jan. 1, 2018, but copies B, C, D can be given "older" age data 404 to trigger a staggered refresh of the copies over time.

Although shown as represented with a month, day, and year timestamp, age data 404 can be represented with any combination of month, day, year, hour, minute, and second corresponding to the last time the copy of the firmware 302 was last written/refreshed in the memory components 112A to 112N. For example, the age data 404 can include the number of second, minutes, days, etc. that have elapsed since the copy of the firmware 302 was last written/refreshed in the memory components 112A to 112N. The processing device can calculate/determine an age for a copy of the firmware 302 by subtracting the current date and/or time from the age data 404 of the copy of the firmware 302. For purposes of illustration, the firmware age table 400 shown in FIG. 4 will be used for explaining the method 200.

At block 206, the processing device determines if any copy of the firmware 302 stored in the memory components 112A to 112N has reached (i.e., is the same or older/greater than) a refresh interval. For example, the refresh interval can be set by a manufacturer of the processing device (e.g., the memory subsystem 110) to be two years (twenty-four months). The refresh interval reflects the period of time up to which data stored in the memory components 112A to 112N should not be degraded beyond the limits of bit error correction utilized by the processing device (e.g., the memory subsystem 110). Accordingly, keeping data (e.g., copies of the firmware 302) in the memory components 112A to 112N longer than the refresh interval can result in the data being degraded beyond the bit error correction capabilities of parity bits stored along with the data in the memory components 112A to 112N. In some embodiments, the refresh interval can be set according to the type of memory used for the memory components 112A to 112N. For example, when the memory components are NAND memory, the refresh interval can be set to a period corresponding to the degradation rate of this type of media (e.g., the refresh interval is set to twenty-four months for NAND memory components). In contrast, when the memory components are erasable programmable read-only memory (EPROM), the refresh interval can be set to a period corresponding to the degradation rate of this type of media (e.g., the refresh interval is set to sixty months for EPROM components).

In some embodiments, the refresh interval can be adjusted according to an age and/or a wear level of the memory components 112A to 112N. For example, after the memory components 112A to 112N have experienced a threshold number of write and/or read cycles, the memory components 112A to 112N can degrade in performance and result in bit errors to occur more rapidly or often. Accordingly, the refresh interval can be reduced when the memory components 112A to 112N have experienced a threshold number of write and/or read cycles to allow for more frequent refreshes of copies of the firmware 302.

When the processing device determines that the age of one or more copies of the firmware 302 have reached the refresh interval, the method 202 moves to block 208. For example, using the age data 404 in the firmware age table 400 and assuming the current date is Jun. 30, 2018, the copy of the firmware 302A has an age of six months (i.e., the difference between the current date and the last written/refresh time provided by the age data 404 for the copy of the firmware 302A is six months), the copy of the firmware 302B has an age of twelve months (i.e., the difference between the current date and the last written/refresh time provided by the age data 404 for the copy of the firmware 302B is twelve months), the copy of the firmware 302C has an age of eighteen months (i.e., the difference between the current date and the last written/refresh time provided by the age data 404 for the copy of the firmware 302C is eighteen months), and the copy of the firmware 302D has an age of twenty-four months (i.e., the difference between the current date and the last written/refresh time provided by the age data 404 for the copy of the firmware 302D is twenty-four months). In this example, when the refresh interval is twenty-four months, the processing device determines at block 206 that the copy of the firmware 302D has reached the refresh interval.

At block 208, the processing device refreshes the one or more copies of the firmware 302 that have reached the refresh interval. For instance, using the example above, since the copy of the firmware 302D has reached the refresh interval of twenty-four months, the processing device refreshes the copy of the firmware 302D in the memory components 112A to 112N. In one embodiment, refreshing the copy of the firmware 302D can include the processing device reading the copy of the firmware 302D from a location in the memory components 112A to 112N, performing bit error correction on the read copy of the firmware 302D (e.g., using parity bits stored along with the copy of the firmware 302D) to produce corrected data, and writing the corrected data to the location in the memory components 112A to 112N corresponding to the copy of the firmware 302D. Accordingly, the copy of the firmware 302D now includes corrected data with no bit errors. Although described in relation to the processing device using the same copy of the firmware 302 for bit error correction that is being refreshed (e.g., performing bit error correction using the copy of the firmware 302D to refresh the copy of the firmware 302D), in some embodiments another copy of the firmware 302 can be used. For example, when the processing device is refreshing the copy of the firmware 302D, the processing device can perform bit error correction using the copy of the firmware 302C. Since the copy of the firmware 302C has not yet reached the refresh interval, it is unlikely that the number of bit errors in the copy of the firmware 302C is beyond the correction capabilities of parity bits stored along with each copy of the firmware 302. In contrast, since the copy of the firmware 302D has reached the refresh interval, the number of bit errors in the copy of the firmware 302D could be beyond the correction capabilities of parity bits stored along with each copy of the firmware 302.

At block 210, the processing device updates the age data 404 for the copies of the firmware 302, which were refreshed in the memory components 112A to 112N at block 208. For instance, in the example above and as shown in FIG. 5, the processing device updates the age data 404 in the firmware age table 400 for the copy of the firmware 302D to the current date and/or time (i.e., the date and/or time the copy of the firmware 302D was refreshed in the memory components 112A to 112N at block 208).

At block 212, which can be arrived at either after block 210 or after determining at block 206 that an age of one or more copies of the firmware 302 has not reached the refresh interval, the processing device determines if a request for a copy of the firmware 302 has been received. For example, booting processing device (e.g., the memory subsystem 110) or receiving a memory access request from the host system 120, can be considered by the processing device as a received request for a copy of the firmware 302. Upon determining that a request for a copy of the firmware 302 has not been received, the method 200 returns to block 206 for the processing device to determine if any copy of the firmware 302 stored in the memory components 112A to 112N is older than the refresh interval. In contrast, upon determining that a request for a copy of the firmware 302 has been received, the method 200 moves to block 214.

At block 214, the processing device reads a copy of the firmware 302 from the memory components 112A to 112N. For example, the processing device can select the youngest copy of the firmware 302 to read from the memory components 112A to 112N at block 214. For example, in the firmware age table 400 of FIG. 5, the copy of the firmware 302D is the youngest such that the processing device reads the copy of the firmware 302D at block 214.

At block 216, the processing device performs bit error correction on the read copy of the firmware 302. For example, based on parity bits stored along with the read copy of the firmware 302 in the memory components 112A to 112N, the processing device performs bit error correction on the read copy of the firmware 302 to attempt to produce corrected data. Since the copies of the firmware 302 in the memory components 112A to 112N have not yet reached the refresh interval, these copies of the firmware 302 should be useable/acceptable after bit error correction (i.e., bit error correction should eliminate all bit errors in the read copy of the firmware 302).

At block 218, the processing device determines whether the number of bit errors in the read copy of the firmware 302 exceeds a correctable threshold error value. For example, when parity bits stored along with each codeword that represents the read copy of the firmware 302 allows for correction of eight bit errors (i.e., the correctable threshold error value is equal to eight), but the number of bit errors in one or more codewords exceeds eight, the processing device determines at block 218 that the number of bit errors in the read copy of the firmware 302 exceeds the correctable threshold error value. Since the number of bit errors in the read copy of the firmware 302 exceeds the correctable threshold error value, corrected data could not be produced at block 216. Although this is a rare occurrence since the copies of the firmware 302 stored in the memory components 112A to 112N are younger than the refresh interval, it is possible that outside factors have resulted in accelerated degradation of data. In response to determining at block 218 that the number of bit errors in the read copy of the firmware 302 exceeds the correctable threshold error value, the method 200 returns to block 214 for the processing device to select another copy of the firmware 302 to read such that error correction can again be performed. In contrast, upon determining that the number of bit errors in the read copy of the firmware 302 does not exceed the correctable threshold error value, the method 200 moves to block 220.

At block 220, the processing device loads the corrected data, which was produced by the processing device at block 216, into main memory of the processing device (e.g., the memory subsystem 110). For example, the processing device loads the corrected data, which represents the firmware 302 without any bit errors, into the local memory 119 of the processing device. Accordingly, the processing device can use the copy of the firmware 302 loaded in the local memory 119 to operate (e.g., to process memory requests from the host system 120). Following block 220, the method 200 returns to block 206 for the processing device to determine if any copy of the firmware 302 stored in the memory components 112A to 112N is older than the refresh interval.

In some embodiments, the processing device can record/note when a number of bit errors in a copy of firmware 302 is determined at block 218 to exceed a correctable threshold error value. In these embodiments, the processing device can refresh this recorded copy upon locating a useable/acceptable copy of firmware 302 (e.g., the processing device writes the corrected data from a useable/acceptable copy of firmware 302 to the location of the memory components 112A to 112N corresponding to the unusable/unacceptable copy of the firmware 302). In this situation, age data 404 for a refreshed copy of the firmware 302 can also be updated to the current date/time.

As described above, the method 200 and the firmware manager 113 manages copies of firmware 302 based on ages of the copies of the firmware 302 instead of or in addition to the number of bit errors in a copy of firmware 302. Accordingly, the processing device (e.g., the memory subsystem 110) ensures that a useable/acceptable copy of firmware is always available with a limited number of refresh/rewrites of the copies of the firmware 302.

As described above, the current date/time can be used for determining the ages of copies of the firmware 302. The processing device can determine the current date/time through various techniques. For example, in one embodiment, the processing device includes an internal clock, which can be battery powered. In another example embodiment, the processing device writes a known sequence of data to a location in the memory components 112A to 112N. Based on a known degradation rate of the memory components 112A to 112N, which can be memory type dependent, the processing device can determine the level of degradation of the known sequence of data and use the known degradation rate of the memory components 112A to 112N to determine elapsed time since the known sequence of data was written to the memory components 112A to 112N. This elapse of time can be extrapolated to determine the current date/time. In still another example embodiment, a host system 120 can report the current date/time to the processing device upon connecting to the processing device and/or at another interval. In yet another embodiment, a host protocol utilized by the host system 120 can report the current date/time to the processing device upon connecting to the host system 120 and/or at another interval. The above techniques allow the processing device to at least be partially powered down while still maintaining the current date/time.

Figure 6:
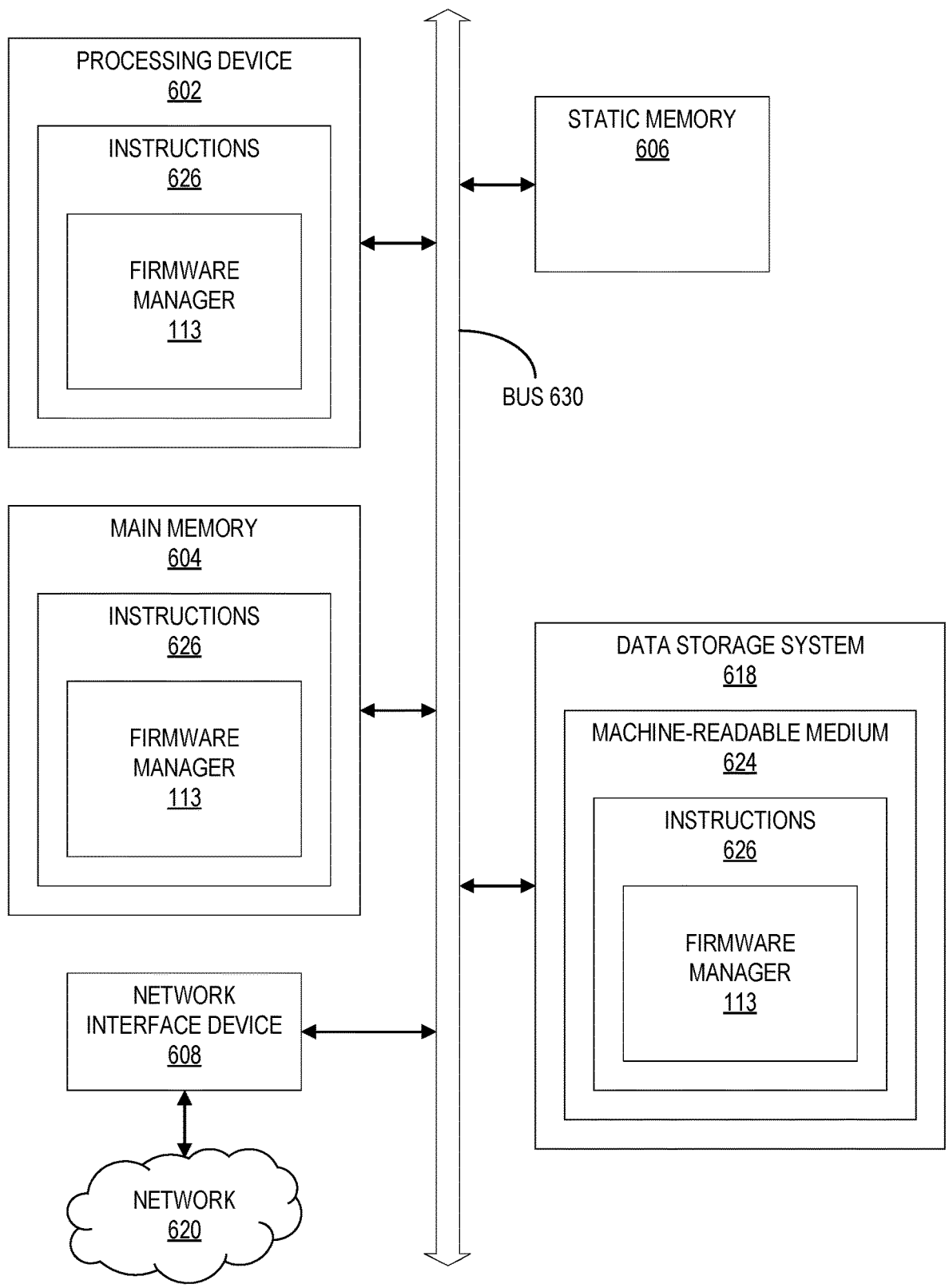
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the firmware manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, an automobile, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a firmware manager (e.g., the firmware manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. For example, a computer system or other data processing system, such as the controller 115, may carry out the computer-implemented method 200 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   writing, by a memory subsystem, a first copy and a second copy of firmware in memory components of the memory subsystem;
   setting, by the memory subsystem in a firmware age table, an age of the first copy of the firmware and an age of the second copy of the firmware, wherein the age of the first copy of the firmware is set to be separated from the age of the second copy of the firmware by a predefined amount;
   determining, by the memory subsystem, whether the age of the first copy of firmware in the firmware age table, which is stored in the memory components of the memory subsystem, is greater than a refresh interval;
   refreshing, by the memory subsystem, the first copy of the firmware in the memory components in response to determining that the age of the first copy of the firmware is greater than the refresh interval; and
   updating, by the memory subsystem, the age of the first copy of the firmware in the firmware age table in response to refreshing the first copy of the firmware.

2. The method of claim 1, wherein the memory components store multiple copies of the firmware, including the first copy of the firmware and the second copy of the firmware, and
   wherein the firmware age table tracks ages of the multiple copies of the firmware.

3. The method of claim 2, wherein the firmware age table includes an entry for each of the multiple copies of the firmware and each entry includes an identifier for each of the multiple copies of the firmware and a timestamp associated with an age of each copy of the firmware that indicates a last write or last refresh of a corresponding copy of the firmware in the memory components.

4. The method of claim 1, wherein the refresh interval is set based on a type of the memory components.

5. The method of claim 1, wherein the refresh interval is updated based on one or more of an age and wear level of the memory components.

6. The method of claim 1, further comprising:
   reading, by the memory subsystem, the first copy of the firmware from the memory components;
   performing, by the memory subsystem, error correction on the read first copy of the firmware to generate an error corrected copy of the read first copy of the firmware;
   reading, by the memory subsystem, the second copy of the firmware from the memory components for use by the memory subsystem when the read first copy of the firmware has a number of bit errors that is greater than or equal to a correctable threshold error value; and
   loading, by the memory subsystem, the error corrected copy of the firmware when the read first copy of the firmware has a number of bit errors that is less than the correctable threshold error value.

7. The method of claim 6, further comprising:
   performing, by the memory subsystem, error correction on the read second copy of the firmware to generate an error corrected copy of the read second copy of the firmware, wherein the error corrected copy of the read second copy of the firmware is loaded by the memory subsystem when the read second copy of the firmware has a number of bit errors that is less than the correctable threshold error value; and
   loading, by the memory subsystem, the error corrected copy of the read second copy of the firmware to a location in the memory components corresponding to the first copy of the firmware when the read second copy of the firmware has a number of bit errors that is less than the correctable threshold error value.

8. A system comprising:
   a plurality of memory components; and
   a processing device, operatively coupled with the plurality of memory components, to:
      write a first copy and a second copy of firmware in the plurality of memory components;
      set in a firmware age table an age of the first copy of the firmware and an age of the second copy of the firmware, wherein the age of the first copy of the firmware is set to be separated from the age of the second copy of the firmware by a predefined amount;
      refresh the first copy of firmware in the plurality of memory components in response to determining that the age of the first copy of the firmware is greater than a refresh interval; and
      update the age of the first copy of the firmware in the firmware age table in response to refreshing the first copy of the firmware.

9. The system of claim 8, wherein the plurality of memory components store multiple copies of the firmware, including the first copy of the firmware and the second copy of the firmware, and
   wherein the firmware age table tracks ages of the multiple copies of the firmware.

10. The system of claim 9, wherein the firmware age table includes an entry for each of the multiple copies of the firmware and each entry includes an identifier for each of the multiple copies of the firmware and a timestamp associated with an age of each copy of the firmware that indicates a last write or last refresh of a corresponding copy of the firmware in the plurality of memory components.

11. The system of claim 8, wherein the refresh interval is set based on a type of the plurality of memory components.

12. The system of claim 8, wherein the refresh interval is updated based on one or more of an age and wear level of the plurality of memory components.

13. The system of claim 8, wherein the processing device is further to:
   read the first copy of the firmware from the plurality of memory components;
   perform error correction on the read first copy of the firmware to generate an error corrected copy of the read first copy of the firmware;
   read the second copy of the firmware from the plurality of memory components for use by the system when the read first copy of the firmware has a number of bit errors that is greater than or equal to a correctable threshold error value; and
   load the error corrected copy of the firmware when the read first copy of the firmware has a number of bit errors that is less than a correctable threshold error value.

14. A non-transitory computer-readable storage medium comprising instructions that, when executed by a processing device, cause the processing device to:
   write a first copy and a second copy of firmware in memory components of the processing device;
   set in a firmware age table an age of the first copy of the firmware and an age of the second copy of the firmware, wherein the age of the first copy of the firmware is set to be separated from the age of the second copy of the firmware by a predefined amount;

determine whether the age of the first copy of firmware in the memory components is greater than a refresh interval;

refresh the first copy of the firmware in the memory components in response to determining that the age of the first copy of the firmware is greater than the refresh interval; and update the age of the first copy of the firmware in the firmware age table in response to refreshing the first copy of the firmware.

15. The non-transitory computer-readable medium of claim 14, wherein the memory components store multiple copies of the firmware, including the first copy of the firmware and the second copy of the firmware, and wherein the firmware age table tracks ages of the multiple copies of the firmware.

16. The non-transitory computer-readable medium of claim 15, wherein the firmware age table includes an entry for each of the multiple copies of the firmware and each entry includes an identifier for each of the multiple copies of the firmware and a timestamp associated with an age of each copy of the firmware that indicates a last write or last refresh of a corresponding copy of the firmware in the memory components.

17. The non-transitory computer-readable medium of claim 14, wherein the refresh interval is set based on one or more of a type of the memory components, an age of the memory components, and a wear level of the memory components.

18. The non-transitory computer-readable medium of claim 14, wherein the processing device is further to:

read the first copy of the firmware from the memory components;

perform error correction on the read first copy of the firmware to generate an error corrected copy of the read first copy of the firmware;

read the second copy of the firmware from the memory components for use by the memory subsystem when the read first copy of the firmware has a number of bit errors that is greater than or equal to a correctable threshold error value; and load the error corrected copy of the firmware when the read first copy of the firmware has a number of bit errors that is less than a correctable threshold error value.

* * * * *